(12) United States Patent
Shirahata et al.

(10) Patent No.: US 6,525,380 B2
(45) Date of Patent: Feb. 25, 2003

(54) CMOS WITH A FIXED CHARGE IN THE GATE DIELECTRIC

(75) Inventors: Masayoshi Shirahata, Tokyo (JP); Masashi Kitazawa, Tokyo (JP); Kazunobu Oota, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/324,805

(22) Filed: Jun. 3, 1999

(65) Prior Publication Data

US 2002/0175380 A1 Nov. 28, 2002

(30) Foreign Application Priority Data

Dec. 7, 1998 (JP) ............................................ 10-346837

(51) Int. Cl.$^7$ ........................ H01L 29/94; H01L 31/113
(52) U.S. Cl. ........................................ 257/369; 257/368
(58) Field of Search .............................. 257/369, 368; 438/199, 288

(56) References Cited

U.S. PATENT DOCUMENTS

| | | | | |
|---|---|---|---|---|
| 3,787,251 A | * | 1/1974 | Brand et al. ................. 148/187 |
| 4,866,002 A | * | 9/1989 | Shizukuishi et al. .......... 437/34 |
| 4,958,204 A | * | 9/1990 | Blanchard et al. ............ 357/22 |
| 5,025,230 A | * | 6/1991 | Kondo et al. ................. 331/116 |
| 5,108,940 A | * | 4/1992 | Williams ....................... 437/44 |
| 5,250,455 A | * | 10/1993 | Ohzone et al. ............... 437/43 |
| 5,264,380 A | * | 11/1993 | Pfiester ......................... 437/37 |
| 5,683,513 A | * | 11/1997 | Fujimaki ...................... 118/688 |
| 5,818,084 A | * | 10/1998 | Williams et al. ............. 257/239 |
| 5,933,721 A | * | 8/1999 | Hause et al. ................. 438/217 |
| 6,054,357 A | * | 4/2000 | Choi ............................. 438/306 |
| 6,175,136 B1 | * | 1/2001 | Okamura ..................... 257/369 |

FOREIGN PATENT DOCUMENTS

EP 0 213 972 * 3/1987 ................. 21/265

OTHER PUBLICATIONS

S. Wolf et al., Silicon Processing for the VLSI Era, vol. 1/ Latice Press, 1986. pp. 223–224.*
S.Wolf et al., Silicon Processing for the VLSI Era, vol. 1. Latice Press, 1986. pp 223–224.*

* cited by examiner

Primary Examiner—Steven Loke
Assistant Examiner—Douglas W. Owens
(74) Attorney, Agent, or Firm—McDermott, Will & Emery

(57) ABSTRACT

A semiconductor device—which includes surface-type n-channel and p-channel single gate transistors by formation of fixed charges within a gate oxide film—and a manufacturing method therefor. A voltage is applied between an electrode connected to a gate electrode and an electrode connected to an N$^+$ region formed in an n-well, and electrons are implanted into the gate electrode at high energy from a substrate, thereby producing fixed negative electric charges in a gate oxide film within an range of 1E11 cm$^{-2}$ to 1E14 cm$^{-2}$. An appropriate value for Vth is obtained in the surface channel MOSFET. Therefore, there are solved problems associated with a dual gate structure; namely, a complicated process flow, etch residues or excessive etching due to a difference in etch rate between n-type polycrystalline silicon and p-type polycrystalline silicon, and the deterioration of a gate oxide film due to penetration of boron ions.

7 Claims, 16 Drawing Sheets

14:fixed electric charge (−)

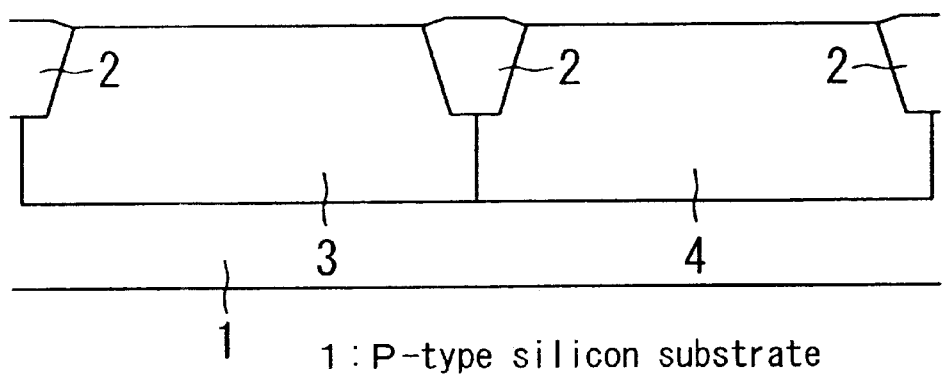
1 : P-type silicon substrate
2 : trench isolation region
3 : P-well
4 : N-well
F I G. 1
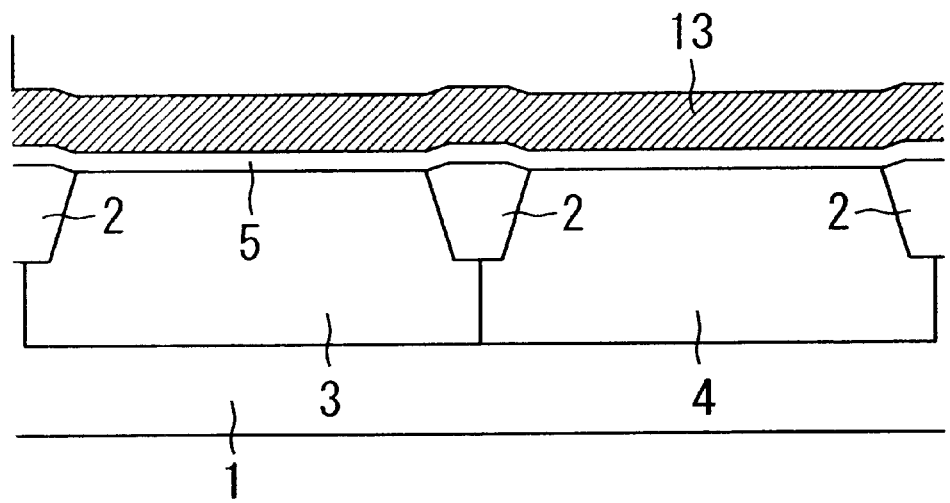
5 : gate oxide film
13 : p-doped polycrystalline silicon layer
F I G. 2

8: LDD region (N⁻) of the N channel MOSFET
9: LDD region (P⁻) of the P channel MOSFET 10: side wall
11: N⁺ source/drain region of the n-channel MOSFET
12: P⁺ source/drain region of the p-channel MOSFET

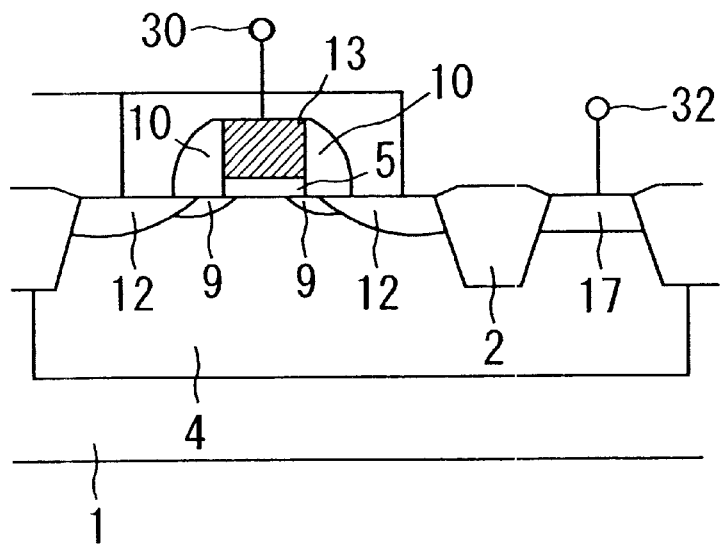
30, 32: electrode
17: N+ region
F I G. 5
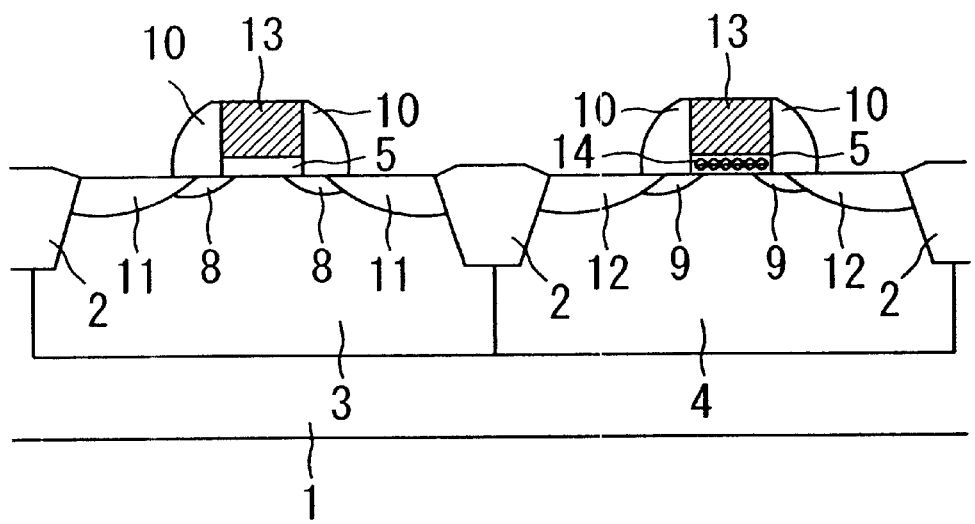
14: fixed electric charge (−)
F I G. 6

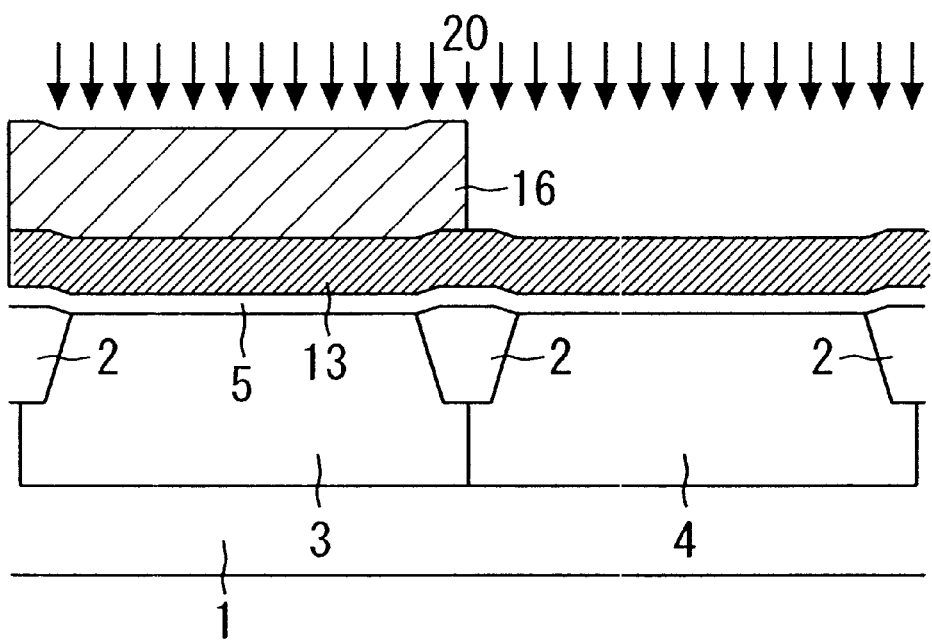
20:boron (B) ions
F I G. 1 2
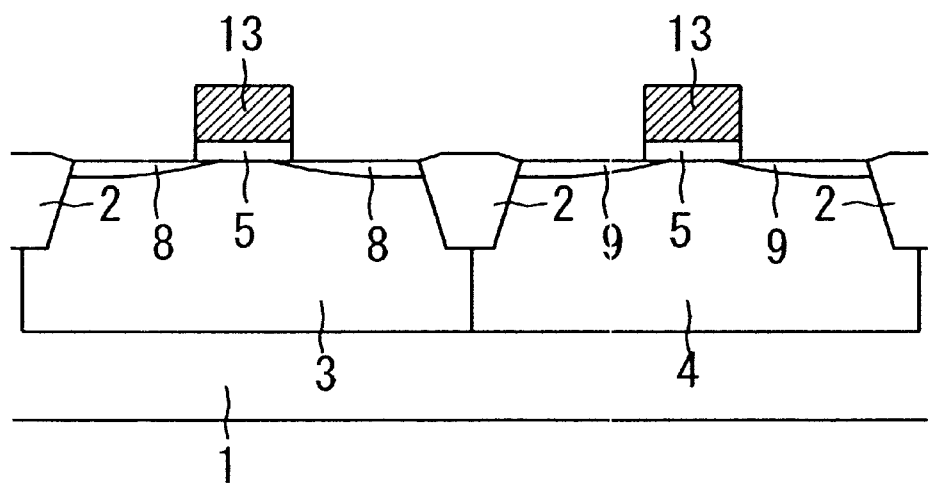
F I G. 1 3

21: B-doped polycrystalline silicon layer

23: fixed charges (+)

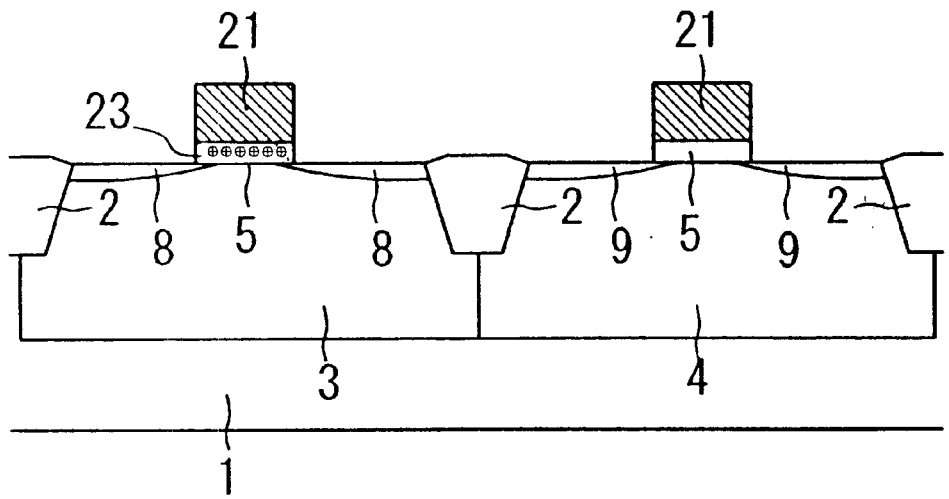
F I G. 1 9
23:fixed charges (+)
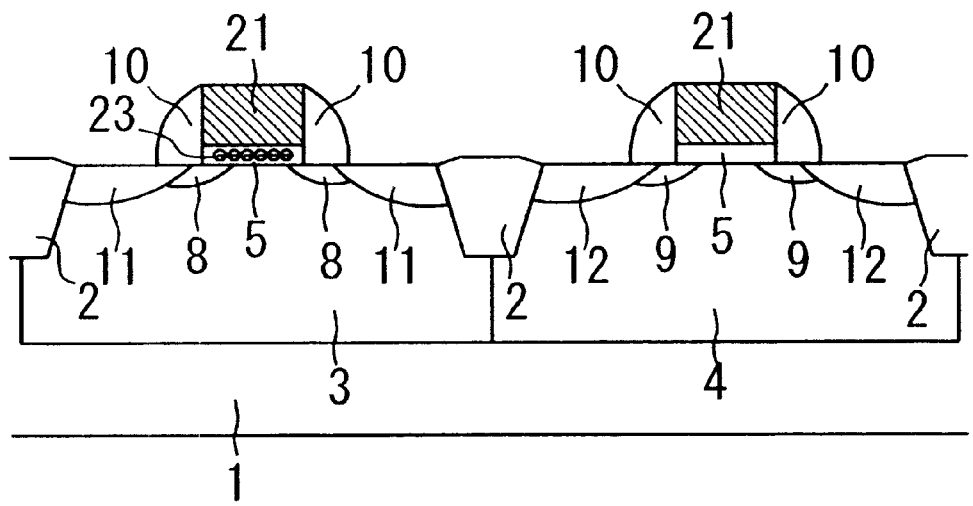
F I G. 2 0

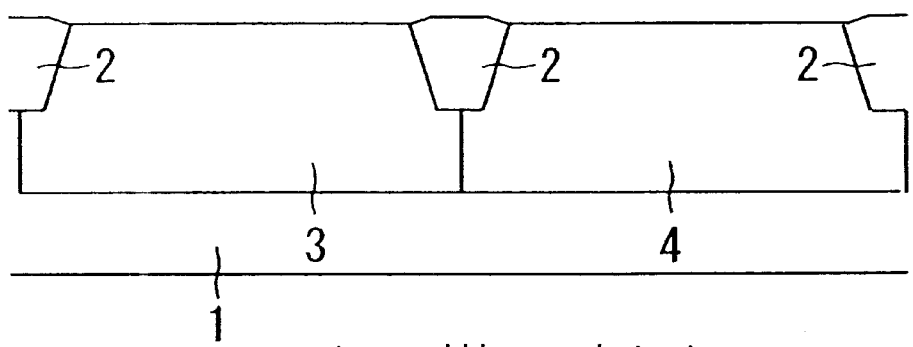
1 : P-type silicon substrate
2 : trench isolation region
3 : P-well
4 : N-well
F I G. 2 4    (BACKGROUND ART)
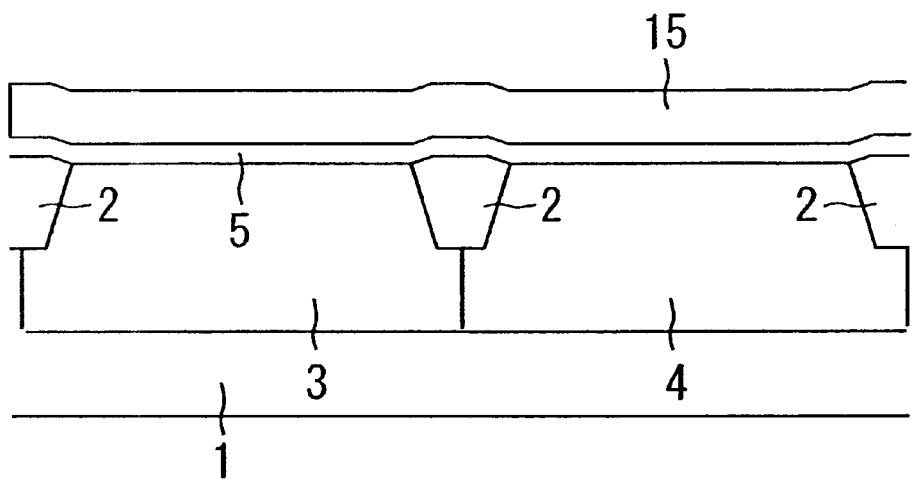
5 : gate oxide film
15 : non-doped polycrystalline silicon layer
F I G. 2 5    (BACKGROUND ART)

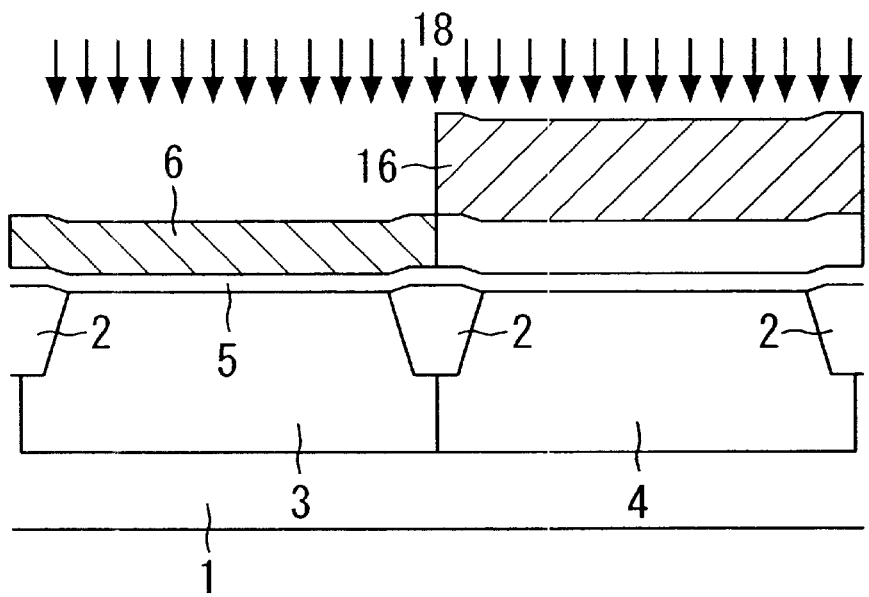
6: N-type polycrystalline silicon layer
16: resist mask
18: phosphor P
F I G. 2 6    (BACKGROUND ART)
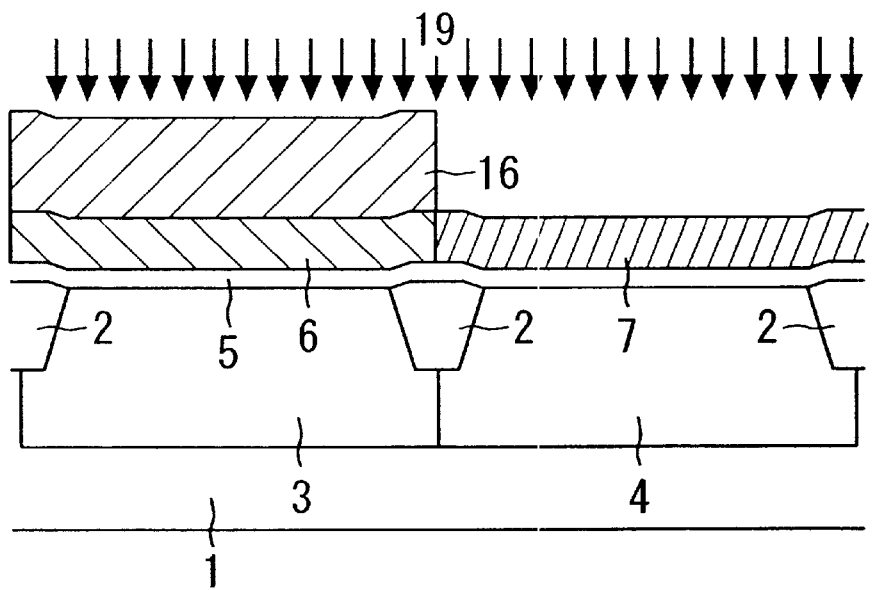
7: P-type polycrystalline silicon layer
19: boron (B) ions
F I G. 2 7    (BACKGROUND ART)

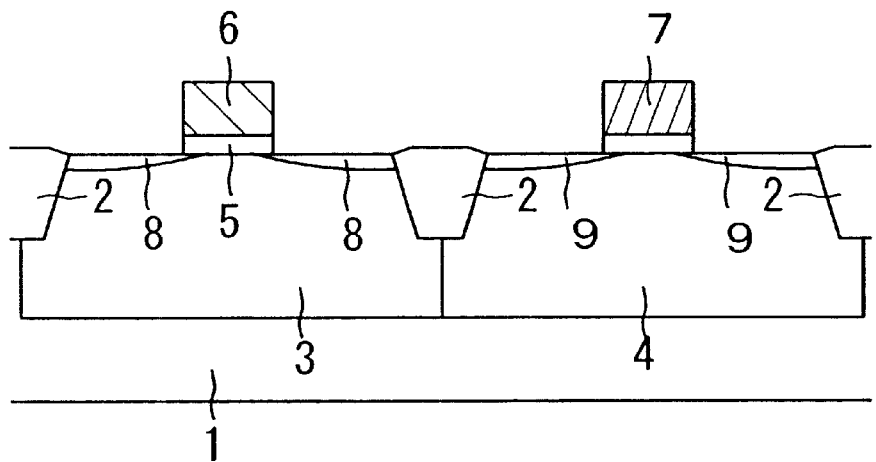
8: LDD region (N⁻) of the N channel MOSFET
9: LDD region (P⁻) of the P channel MOSFET
F I G. 2 8     (BACKGROUND ART)
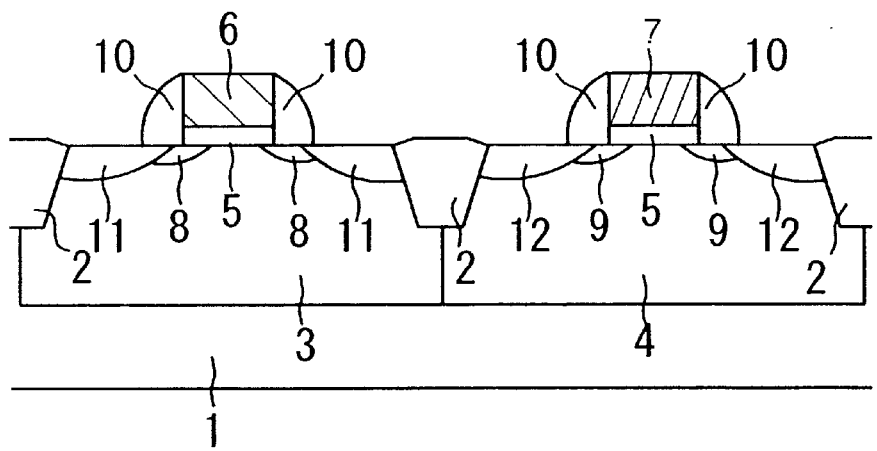
10: side wall
11: N⁺ source/drain region of the n-channel MOSFET
12: P⁺ source/drain region of the p-channel MOSFET
F I G. 2 9     (BACKGROUND ART)

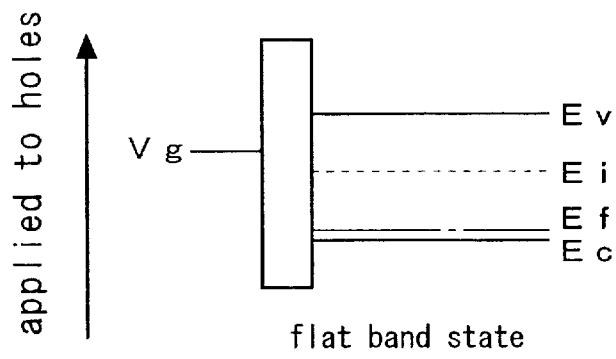
F I G. 3 0 (BACKGROUND ART)
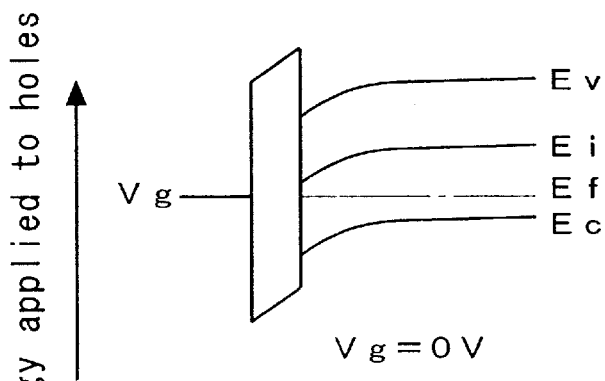
F I G. 3 1 (BACKGROUND ART)
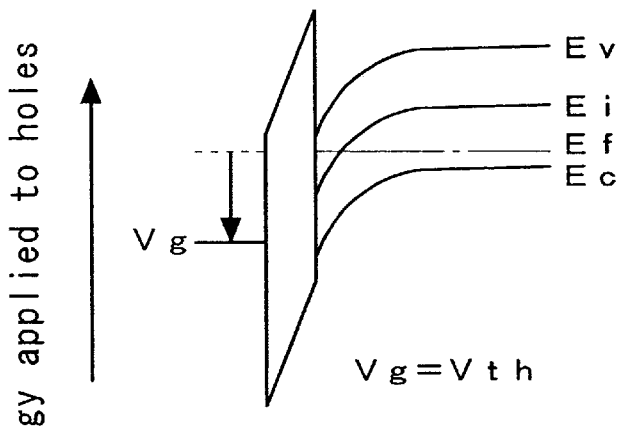
F I G. 3 2 (BACKGROUND ART)

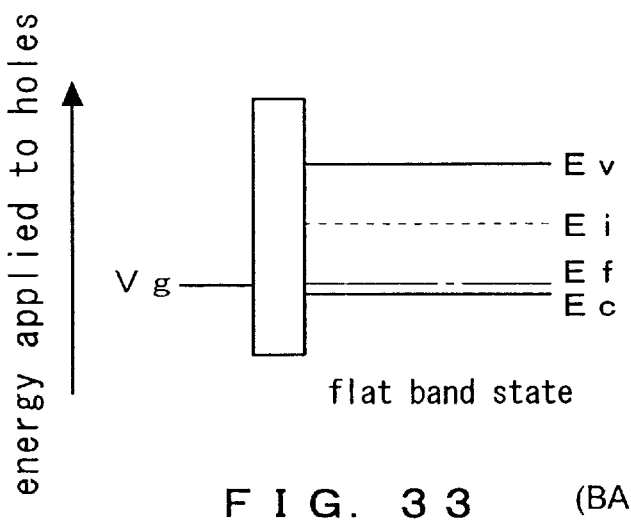
FIG. 33    (BACKGROUND ART)
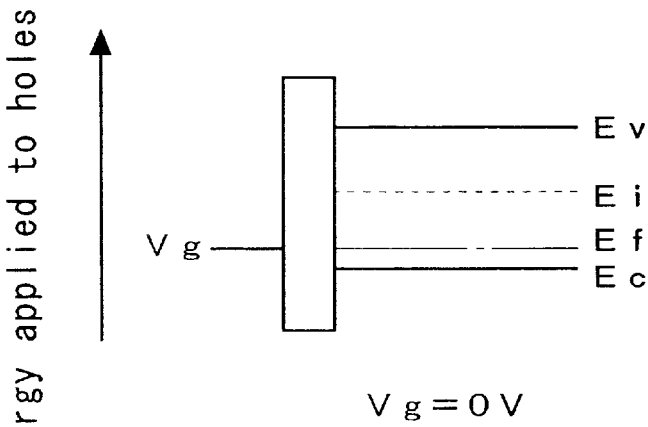
FIG. 34    (BACKGROUND ART)
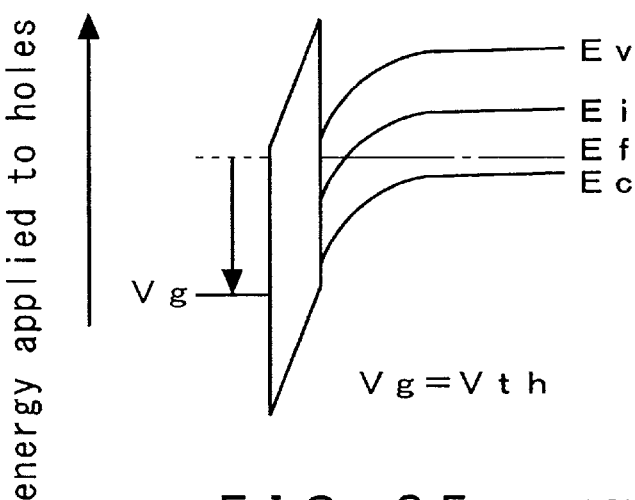
FIG. 35    (BACKGROUND ART)

CMOS WITH A FIXED CHARGE IN THE GATE DIELECTRIC

BACKGROUND OF THE INVENTION

1. Field of the Invention

The present invention relates to a semiconductor device, and more particularly, to a semiconductor device of CMOS structure and to a manufacturing method therefor.

2. Description of Related Art

In association with recent improvement in the integration and miniaturization of semiconductor devices, the gate electrode of a MOSFET has become shorter, and a transistor having a gate length of 0.2 μm or less is currently used. In a conventional CMOS structure, an n-channel MOSFET is formed along the surface of a wafer, whereas a p-channel MOSFET is formed so as to be embedded in the wafer. As the gate length becomes shorter, it becomes difficult to reduce a threshold voltage (Vth) of an embedded p-channel transistor which shows noticeable short channel characteristics. For this reason, there has been employed a p-channel MOSFET which is also formed along the surface of the wafer. As a result, there has been employed a dual gate structure in which the gates of n-channel and p-channel MOSFETs are used as gates.

FIGS. 24 through 29 show a method of manufacturing a conventional semiconductor device employing a dual gate structure. With reference to FIGS. 24 through 29, a flow of manufacture of a conventional semiconductor device will now be described in sequence.

As shown in FIG. 24, trench isolation structures 2 are formed in the surface of a p-type silicon substrate 1, thus dividing the surface of the substrate 1 into the trench isolation structures 2 and remaining active regions 3 and 4. Through photolithography and implantation, the active regions are transformed respectively into a p-well 3 and an n-well 4.

As shown in FIG. 25, a gate oxide film 5 is formed over the trench isolation structures 2, the p-well 3, and the n-well 4. Subsequently, a non-doped polycrystalline silicon layer 15 is formed on the gate oxide film 5.

As shown in FIG. 26, through photolithography a resist mask 16 is formed on the non-doped polycrystalline silicon layer 15. The non-doped polycrystalline silicon layer 15 that remains on the p-well 3 is doped with Phosphor (P) ions 18 implanted at 30 KeV and $2E15$ $cm^{-2}$, whereby the thus-doped area of the polycrystalline silicon layer 15 is transformed into an n-type polycrystalline silicon layer 6.

As shown in FIG. 27, through photolithography a resist mask 16 is formed on the non-doped polycrystalline silicon layer 15 that remains over the p-well 3. The non-doped polycrystalline silicon layer 15 that remains on the n-well 4 is doped with boron (B) ions 19 implanted at 20 KeV and $2E15$ $cm^{-2}$, whereby the thus-doped area of the polycrystalline silicon layer 15 is transformed into a p-type polycrystalline silicon layer 7. The wafer is again subjected to photolithography in order to pattern gate electrodes, and gate electrodes are formed through etching by use of a resist mask.

FIG. 28 shows the wafer after the gate electrodes have been formed by etching. In FIG. 28, the gate electrode of the n-channel MOSFET is formed from the n-type polycrystalline silicon layer 6 (a gate electrode 6) and the oxide film 5 (a gate oxide film). The gate electrode of the p-channel MOSFET is formed from a p-type polycrystalline silicon layer 7 (a gate electrode 7) and the oxide film 5 (a gate oxide film). As shown in FIG. 28, a lightly doped drain (LDD) region (N⁻) 8 of the n-channel MOSFET and a lightly doped drain (LDD) region (P⁻) 9 of the p-channel MOSFET are each formed through photolithography and ion implantation.

As shown in FIG. 29, through CVD side walls 10 are formed from an oxide film on both sides of each of the gate electrodes 6 and 7. An N⁺ source/drain region 11 of the n-channel MOSFET and a P⁺ source/drain region 12 of the p-channel MOSFET are each formed through photolithography and ion implantation.

According to the method of manufacturing a conventional dual gate semiconductor device having the previously-described surface channel type P-MOSFET, at the time of formation of gate electrodes a non-doped polycrystalline silicon is deposited on the surface of a wafer, and the wafer surface is formed into n-type and p-type regions through ion implantation by use of a mask. Thus, addition of the photolithography and ion implantation steps renders the manufacturing processes complicate. A polycrystalline silicon layer formed through ion implantation contains an insufficient amount of doped impurities in contrast with a polycrystalline silicon layer which is doped with phosphor ions during deposition. As a result, a gate region is depleted of carriers. Further, since there is a difference in etch rate between etching of n-type polycrystalline silicon and p-type polycrystalline silicon at the time of formation of a gate electrode through etching, unetched portions of the polycrystalline silicon may remain on the wafer or etching may not be blocked by the gate oxide film, thereby etching away the substrate beneath the gate oxide film. Thus, a difference in etch rate renders manufacture of a semiconductor device difficult. Furthermore, there may arise a boron (B) penetration phenomenon, in which boron (B) ions implanted for the purpose of forming a p-type polycrystalline silicon layer penetrate through the gate oxide film in a subsequent heat treatment process, thus deteriorating the reliability of the gate oxide film.

For these reasons, a desirable gate structure is not a dual gate structure comprising n-type and p-type MOSFETs which are formed on a single polycrystalline silicon substrate, but a single gate structure doped with either n-type or p-type impurities. When a semiconductor device is manufactured through use of a single gate structure, a MOSFET which is of either an n-channel or a p-channel must be formed so as to become embedded in the substrate, in order to prevent the threshold voltage (Vth) from becoming excessively high. Further, the short channel characteristics may become noticeable in the embedded channel MOSFET.

FIGS. 30 through 35 show a surface channel MOSFET of single gate structure, and account for an increase in the threshold voltage Vth by reference to a p-channel MOSFET. FIG. 30 shows an energy band in a depthwise direction in a dual gate structure in which a p-type polycrystalline silicon layer is formed on the n-well, particularly showing a flat-band state of the dual gate structure. In FIG. 30, the vertical axis depicts energy applied to holes, and Ev represents a valence band; Ec represents a conduction band; Ef represents a Fermi level; Ei represents an intrinsic potential; and Vg represents a gate potential. In the flat band state shown in FIG. 30, there is a difference between the Fermi level Ef and the gate potential Vg. The reason for this is that, in the n-well, the Fermi level Ef is in the vicinity of the conduction band, and, since the gate is of p-type, the gate potential Vg is in the vicinity of the valence band.

FIG. 31 shows an energy band in a case where Vg=0V. As shown in FIG. 30, there is a difference between the Fermi level Fe and the gate potential Vg in the flat band state. For this reason, the energy band is bent so as to eliminate the difference, as shown in FIG. 31. Therefore, even when Vg=0V, the energy band is bent in a direction in which the transistor is turned on; specifically, in a direction in which an inverted channel can be established.

FIG. 32 is an energy band in a case where Vg=Vth. As shown in FIG. 31, the energy band is bent toward a direction in which the transistor is turned on, even when Vg=0V, and the threshold voltage Vth required to turn on the transistor assumes a value of about 0.6V. An explanation is now given of a single gate structure in which an n-type polycrystalline silicon layer is formed on the n-well.

FIG. 33 shows a flat band state of the single gate structure. As shown in FIG. 33, since the gate electrode is also of an n-type, the gate potential Vg becomes close to the conduction band Ec in close proximity to the Fermi level Ef. Accordingly, when Vg=0V as shown in FIG. 34, the energy band is substantially identical with the flat band and is not bent.

FIG. 35 shows an energy band when Vg=Vth. As shown in FIG. 34, the gate potential Vg originally assumes a value of 0V and is close to the flat band. As shown in FIG. 35, the gate voltage Vg required to induce inverted carriers becomes nearly 0.8V higher than the gate voltage Vg required for the dual gate structure; namely, the threshold voltage assumes a value of about 1.4V. Thus, when a surface-type p-channel MOSFET is formed through use of n-type polycrystalline silicon, the threshold voltage becomes higher.

As mentioned above, in a case where a semiconductor device is manufactured by use of a dual gate structure, the threshold voltage Vth becomes too high unless MOSFETs of either a p-channel or n-channel are formed so as to be embedded in the substrate. If the MOSFETs are formed so as to become embedded in the substrate, the short channel characteristic becomes noticeable. In contrast, in a case where a surface-type p-channel MOSFET is formed into a single gate structure by use of n-type polycrystalline silicon, the threshold voltage Vth becomes high.

SUMMARY OF THE INVENTION

Accordingly, the present invention has been conceived to solve the aforementioned problems, and the object of the present invention is to provide a semiconductor device comprising surface-type n-channel and p-channel single gate transistors by formation of fixed charges within a gate oxide film, and to provide a manufacturing method therefor.

According to a first aspect of the present invention, there is provided a semiconductor device comprising: a semiconductor substrate of first conductivity type; a well of first conductivity type formed on the surface of the semiconductor substrate of first conductivity type; a well of second conductivity type formed on the surface of the semiconductor substrate of first conductivity type; a gate dielectric film formed over the well of first conductivity type and the well of second conductivity type through thermal oxidation; a polycrystalline silicon layer of second conductivity type formed on the gate dielectric film; a gate formed by etching the polycrystalline silicon layer of second conductivity type; a side wall formed from an oxide film on the gate through CVD oxide film; and fixed electric charges of second conductivity type within the gate dielectric film.

According to a second aspect of the present invention, there is provided a method of manufacturing a semiconductor device comprising the steps of: forming a trench isolation region in the surface of a semiconductor substrate of first conductivity type; forming the trench isolation region and active regions including a well of first conductivity type and a well of second conductivity type; forming a gate dielectric film over the trench isolation region and the active regions through thermal oxidation; forming a polycrystalline silicon layer of second conductivity type on the gate dielectric film; forming a gate by etching the polycrystalline silicon layer of second conductivity type; forming a side wall formed on the gate through CVD oxide film; and forming fixed electric charges of second conductivity type within the gate dielectric film by application of a voltage across the gate and the well of second conductivity type, and by implantation of electric charges of second conductivity type at high energy from the semiconductor substrate.

The above and other objects, effects, features and advantages of the present invention will become more apparent from the following description of the embodiments thereof taken in conjunction with the accompanying drawings.

BRIEF DESCRIPTION OF THE DRAWINGS

FIGS. 1 through 6 show a method of manufacturing a semiconductor device of CMOS structure according to a embodiment 1 of the present invention.

FIG. 1 shows that trench isolation regions 2 are formed in the surface of a p-type silicon substrate (semiconductor substrate) 1.

FIG. 2 shows that through thermal oxidation a gate oxide film 5 (a dielectric film) is formed over the isolation regions 2, the p-well 3, and the n-well 4.

FIG. 3 shows that gate electrodes are formed through photolithography and etching by use of a resist mask.

FIG. 4 shows that through CVD side walls 10 are formed from an oxide film on both sides of each of the gate oxide film 5 and the gate electrode 13.

FIG. 5 shows that a voltage is applied between an electrode 30 connected to the gate electrode 13 and an electrode 32 connected to an N$^+$ region 17 formed in the n-well 4, and electrons are implanted into the gate electrode at high energy from the substrate 1.

FIG. 6 shows a semiconductor device of CMOS structure which is formed according to the previously-described manufacturing process flow and comprises a surface-type n-channel MOSFET of single gate structure and a surface-type p-channel MOSFET of single gate structure.

FIGS. 10 through 15 show a method of manufacturing a semiconductor device of CMOS structure according to a embodiment 2 of the present invention.

FIG. 10 shows that trench isolation regions 2 are formed in the surface of a p-type silicon substrate 1.

FIG. 11 shows that through thermal oxidation a gate oxide film 5 is formed over the isolation regions 2, the p-well 3, and the n-well 4.

FIG. 12 shows that through photolithography a resist mask 16 is formed on the area of the p-type doped polycrystalline silicon layer 13 corresponding to the p-well 3.

FIG. 13 shows that gate electrodes are formed through photolithography and etching by use of a resist mask.

FIG. 14 shows that through CVD employing an oxide film, side walls 10 are formed on both sides of each of the gate oxide film 5 and the gate electrode 13.

FIG. 15 shows a semiconductor device of CMOS structure which is formed according to the previously-described manufacturing process flow and comprises a surface-type n-channel MOSFET of single gate structure and a surface-type p-channel MOSFET of single gate structure.

FIGS. 16 through 20 show a method of manufacturing a semiconductor device of CMOS structure according to a embodiment 3 of the present invention.

FIG. 16 shows that trench isolation regions 2 are formed in the surface of a p-type silicon substrate 1.

FIG. 17 shows that a gate oxide film 5 is formed over the isolation regions 2, the p-well 3, and the n-well 4 through thermal oxidation.

FIG. 18 shows that through photolithography a resist mask 16 is formed on the area of the boron-doped polycrystalline silicon layer 21 corresponding to the n-well 4.

FIG. 19 shows that gate electrodes are formed through photolithography and etching by use of a resist mask.

FIG. 20 shows that through CVD side walls 10 are formed from an oxide film on both sides of each of the gate oxide film 5 and the gate electrode 21.

FIGS. 24 through 29 show a method of manufacturing a conventional semiconductor device employing a dual gate structure.

FIG. 24 shows that trench isolation structures 2 are formed in the surface of a p-type silicon substrate 1.

FIG. 25 shows that a gate oxide film 5 is formed over the trench isolation structures 2, the p-well 3, and the n-well 4.

FIG. 26 shows that through photolithography a resist mask 16 is formed on the non-doped polycrystalline silicon layer 15.

FIG. 27 shows that through photolithography a resist mask 16 is formed on the non-doped polycrystalline silicon layer 15 that remains over the p-well 3.

FIG. 28 shows the wafer after the gate electrodes have been formed by etching.

FIG. 29 shows that through CVD side walls 10 are formed from an oxide film on both sides of each of the gate electrodes 6 and 7.

FIGS. 30 through 35 show a surface channel MOSFET of single gate structure, and account for an increase in the threshold voltage Vth by reference to a p-channel MOSFET.

FIG. 30 shows an energy band in a depthwise direction in a dual gate structure in which a p-type polycrystalline silicon layer is formed on the n-well, particularly showing a flat-band state of the dual gate structure.

FIG. 31 shows an energy band in a case where Vg=0V.

FIG. 32 shows an energy band in a case where Vg=Vth.

FIG. 33 shows a flat band state of the single gate structure.

FIG. 34 shows that the energy band is substantially identical with the flat band and is not bent.

FIG. 35 shows an energy band when Vg=Vth.

DETAILED DESCRIPTION OF THE PREFERRED EMBODIMENTS

Figure 3:
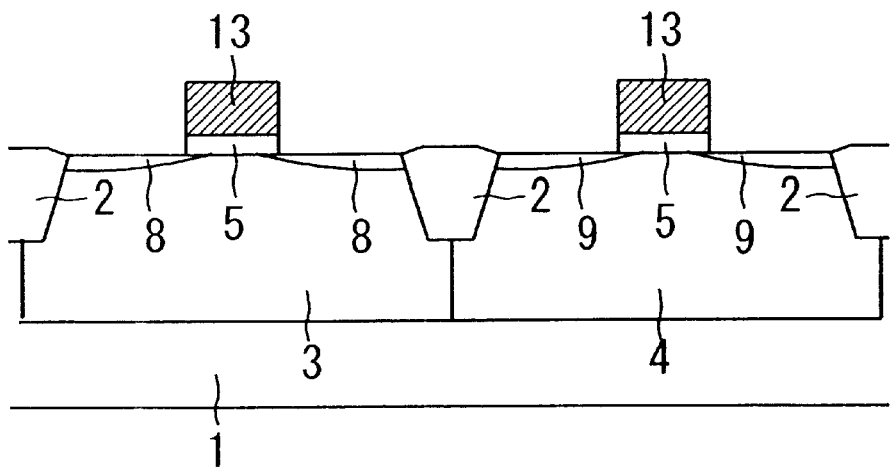

Embodiments of the present invention will be described below with reference to the accompanying drawings. It is noted that the same reference symbols in the drawings denote the same or corresponding components.

Embodiment 1

FIGS. 1 through 6 show a method of manufacturing a semiconductor device of CMOS structure according to a embodiment 1 of the present invention. A manufacturing process flow according to the present invention will be described in sequence.

As shown in FIG. 1, trench isolation regions 2 are formed in the surface of a p-type silicon substrate (semiconductor substrate) 1, thus dividing the substrate surface into the trench isolation regions 2 and the remaining active regions 3 and 4. Through photolithography and ion implantation, the active regions 3 and 4 are transformed into a p-well 3 and an n-well 4.

As shown in FIG. 2, through thermal oxidation a gate oxide film 5 (a dielectric film) is formed over the isolation regions 2, the p-well 3, and the n-well 4. A P-doped polycrystalline silicon layer 13 is formed on the gate oxide film 5.

As shown in FIG. 3, gate electrodes are formed through photolithography and etching by use of a resist mask. A lightly doped drain (LDD) region ($N^-$) 8 of the n-channel MOSFET and a lightly doped drain (LDD) region ($P^-$) 9 of the p-channel MOSFET are each formed through photolithography and ion implantation. In FIG. 3, the gate electrode of the n-channel MOSFET is formed from a P-doped (n-type or n-type doped) polycrystalline silicon layer 13 (or a gate electrode 13) and a gate oxide film 5. The gate eletrode of the p-channel MOSFET is formed from the P-doped polycrystalline silicon layer 13 (the gate electrode 13) and the gate oxide film 5.

Figure 4:
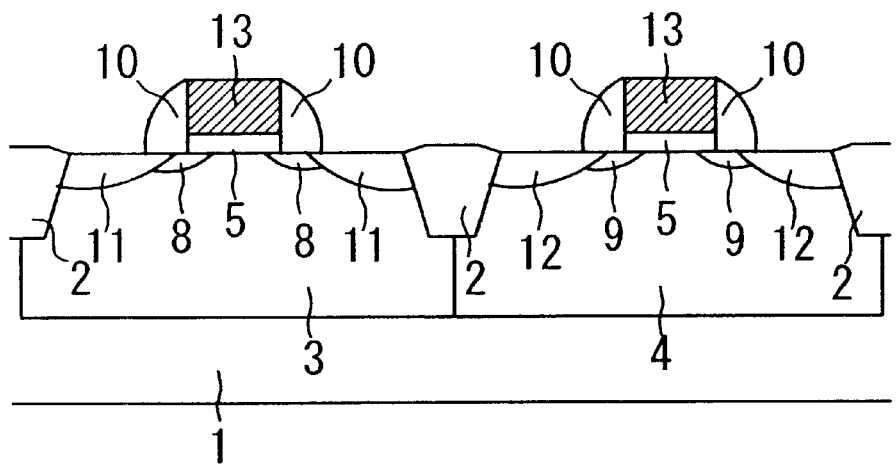

As shown in FIG. 4, through CVD side walls 10 are formed from an oxide film on both sides of each of the gate oxide film 5 and the gate electrode 13. An $N^+$ source/drain region 11 of the n-channel MOSFET and a $P^+$ source/drain region 12 of the p-channel MOSFET are each formed through photolithography and ion implantation.

As shown in FIG. 5, a voltage is applied between an electrode 30 connected to the gate electrode 13 and an electrode 32 connected to an $N^+$ region 17 formed in the n-well 4, and electrons are implanted into the gate electrode at high energy from the substrate 1, thereby producing fixed negative electric charges 14 in the gate oxide film 5 within an range of 1E11 $cm^{-2}$ to 1E14 $cm^{-2}$.

FIG. 6 shows a semiconductor device of CMOS structure which is formed according to the previously-described manufacturing process flow and comprises a surface-type n-channel MOSFET of single gate structure and a surface-type p-channel MOSFET of single gate structure.

Figure 7:
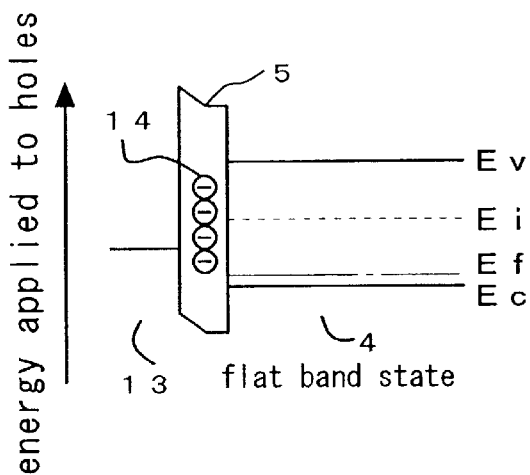
FIG. 7 shows the flat band state of the p-channel MOSFET.
Figure 8:
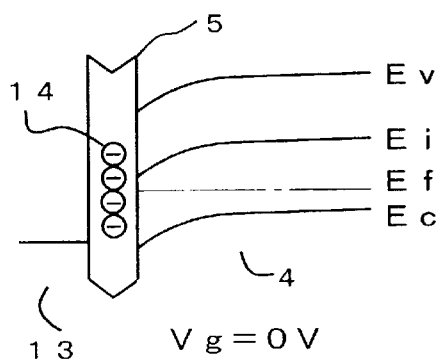
FIG. 8 shows a bend in the energy band when Vg=0V.
Figure 9:
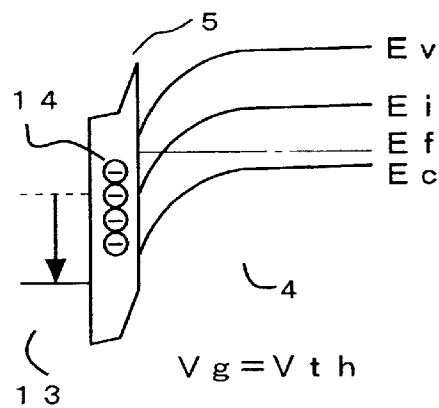
FIG. 9 shows an energy band when Vg=Vth.

By reference to FIGS. 7 through 9 showing energy bands, there is described the reason why the threshold voltage Vth does not become high even when a surface-type p-channel MOSFET is formed from the P-doped polycrystalline silicon according to the embodiment 1.

FIG. 7 shows the flat band state of the p-channel MOSFET. As shown in FIG. 7, although the energy band of the n-well 4 is flat, a potential difference develops in the gate oxide film 5 by virtue of existence of the fixed electric charges 14 in the gate oxide film 5. Therefore, there is a potential difference between the gate electrode 13 and the Fermi energy Ef of the n-well 4.

FIG. 8 shows a bend in the energy band when Vg=0V. As shown in FIG. 8, the energy band is bent toward a direction in which the channel is established, by means of the fixed negative electric charges 14.

FIG. 9 shows an energy band when Vg=Vth. Since the energy band is bent toward a direction in which the MOSFET is turned on when Vg=0V, as shown in FIG. 8, the gate potential Vg is only required to be increased slightly to the threshold voltage. Therefore, as shown in FIG. 9, the threshold voltage Vth assumes a value of about 0.6V.

As mentioned previously, according to the embodiment 1, an appropriate value for Vth is obtained in the surface channel MOSFET. Therefore, the present invention has an advantage of the ability to prevent problems associated with the dual gate structure; namely, a complicated process flow, etch residues or excessive etching due to a difference in etch rate between n-type polycrystalline silicon and p-type polycrystalline silicon, and the deterioration of a gate oxide film due to penetration of boron ions. Further, since the surface channel MOSFET can be used, there can be realized a Vth which is lower than that required by a buried channel MOSFET.

Although the embodiment 1 describes the case where fixed negative electric charges are formed within the oxide film on the p-channel MOSFET through use of n-type doped polycrystalline silicon, the same advantageous result is yielded even when fixed positive electric charges are formed within an oxide film on the n-channel MOSFET through use of p-type doped polycrystalline silicon.

Embodiment 2

FIGS. 10 through 15 show a method of manufacturing a semiconductor device of CMOS structure according to a embodiment 2 of the present invention. A process flow according to the embodiment 2 will be described in sequence.

Figure 10:
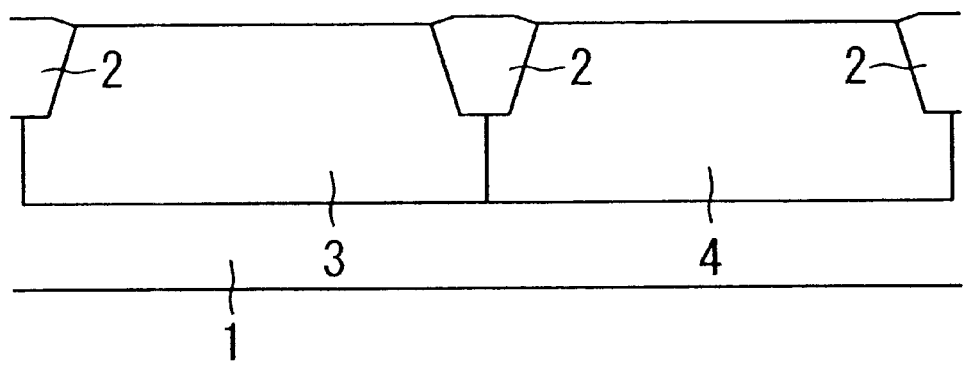

As shown in FIG. 10, trench isolation regions 2 are formed in the surface of a p-type silicon substrate 1, thus dividing the substrate surface into the trench isolation regions 2 and the remaining active regions 3 and 4. Through photolithography and ion implantation, the active regions 3 and 4 are transformed into a p-well 3 and an n-well 4.

Figure 11:
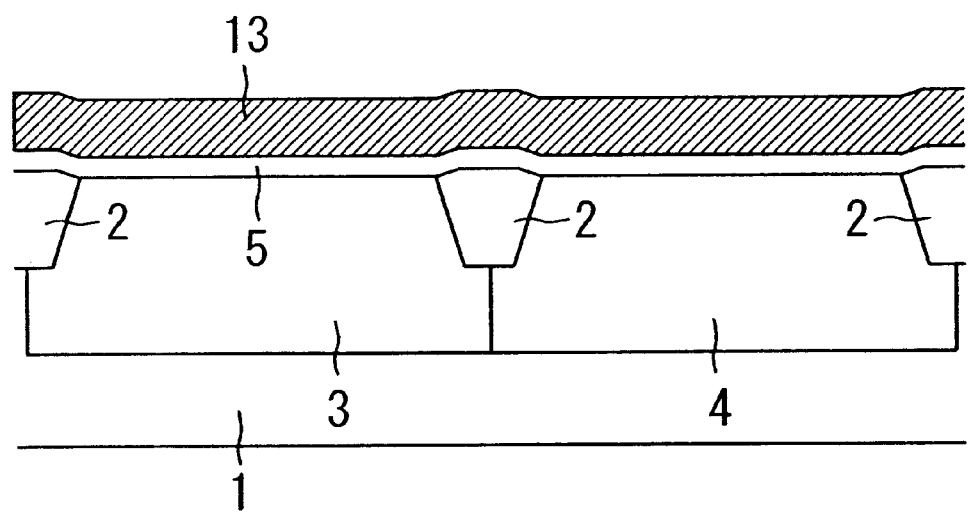

As shown in FIG. 11, through thermal oxidation a gate oxide film 5 is formed over the isolation regions 2, the p-well 3, and the n-well 4. A P-doped polycrystalline silicon layer 13 is then formed on the gate oxide film 5.

As shown in FIG. 12, through photolithography a resist mask 16 is formed on the area of the P-doped polycrystalline silicon layer 13 corresponding to the p-well 3. The area of the P-doped polycrystalline silicon layer 13 corresponding to the n-well 4 is doped with boron ions 20 at 30 KeV and 5E14 $cm^{-2}$, so that the thus-implanted area of the P-doped polycrystalline silicon layer 13 is doped with boron. Here, the boron concentration is set so as to become lower than the original phosphor concentration, thereby preventing transformation of the doped region to a p-type.

As shown in FIG. 13, gate electrodes are formed through photolithography and etching by use of a resist mask. A lightly doped drain (LDD) region (N−) 8 of the n-channel MOSFET and a lightly doped drain (LDD) region (P−) 9 of the p-channel MOSFET are each formed through photolithography and ion implantation. In FIG. 13, the gate electrode of the n-channel MOSFET is formed from a P-doped polycrystalline silicon layer 13 including boron (or a n-type gate electrode 13) and a gate oxide film 5. The gate electrode of the p-channel MOSFET is formed from the P-doped polycrystalline silicon layer 13 including boron (the gate electrode 13) and the gate oxide film 5.

Figure 14:
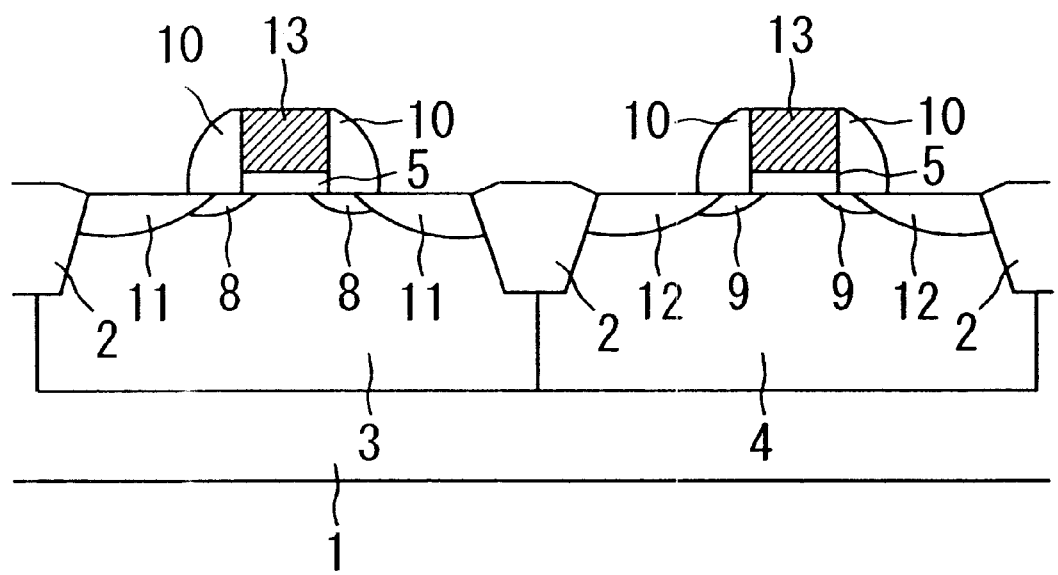

As shown in FIG. 14, through CVD employing an oxide film, side walls 10 are formed on both sides of each of the gate oxide film 5 and the gate electrode 13. An N+ source/drain region 11 of the n-channel MOSFET and a P+ source/drain region 12 of the p-channel MOSFET are each formed through photolithography and ion implantation. Subsequently, the wafer is subjected to heat treatment at 800° C. for 20 minutes. As a result, boron ions contained in the polycrystalline silicon layer 13 of the p-channel MOSFET diffuse into the gate oxide film 5, thereby forming fixed negative electric charges 14.

Figure 15:
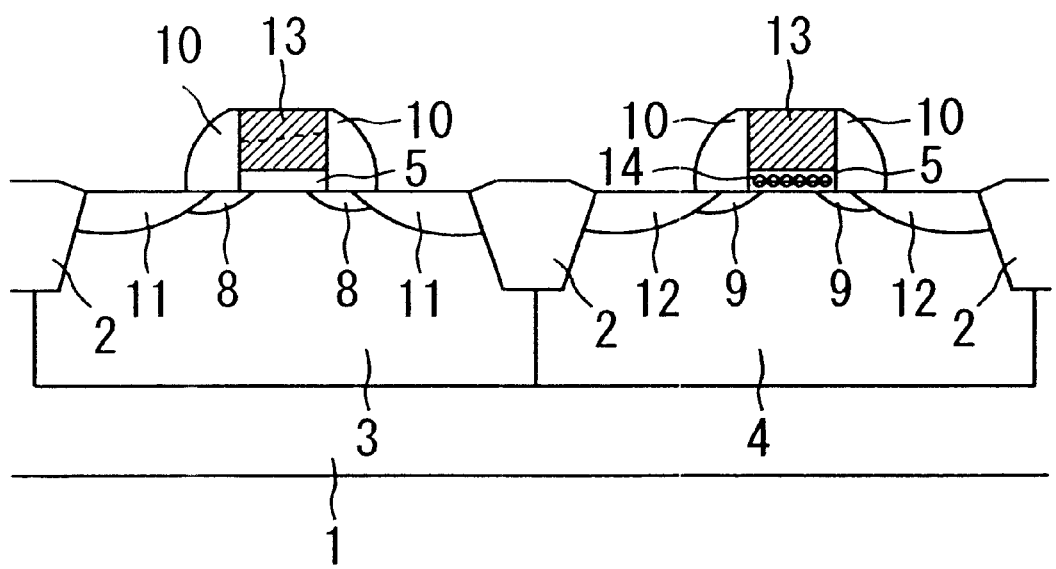

FIG. 15 shows a semiconductor device of CMOS structure which is formed according to the previously-described manufacturing process flow and comprises a surface-type n-channel MOSFET of single gate structure and a surface-type p-channel MOSFET of single gate structure.

As mentioned above, according to the embodiment 2, an appropriate value for Vth is ensured in the surface channel MOSFET. Therefore, the present invention has an advantage of the ability to prevent problems associated with the dual gate structure; namely, a complicated process flow and etch residues or excessive etching due to a difference in etch rate between n-type polycrystalline silicon and p-type polycrystalline silicon. Further, since the surface channel MOSFET can be used, there can be realized a Vth which is lower than that required by a buried channel MOSFET.

Embodiment 3

FIGS. 16 through 20 show a method of manufacturing a semiconductor device of CMOS structure according to a embodiment 3 of the present invention. A process flow according to the embodiment 3 will be described in sequence.

Figure 16:
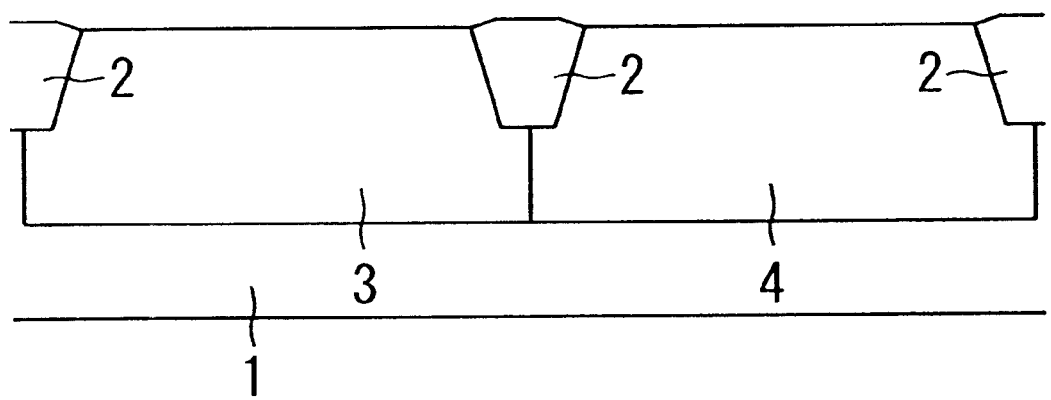

As shown in FIG. 16, trench isolation regions 2 are formed in the surface of a p-type silicon substrate 1, thus dividing the substrate surface into the trench isolation regions 2 and the remaining active regions 3 and 4. Through photolithography and ion implantation, the active regions 3 and 4 are transformed respectively into a p-well 3 and an n-well 4.

Figure 17:
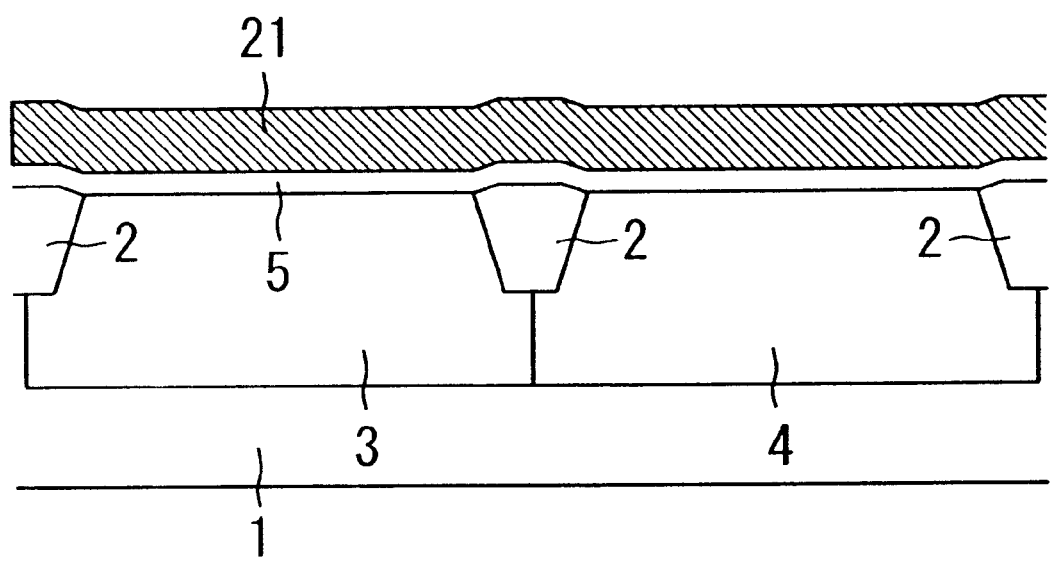

As shown in FIG. 17, a gate oxide film 5 is formed over the isolation regions 2, the p-well 3, and the n-well 4 through thermal oxidation. A boron-doped polycrystalline silicon layer 21 is formed on the gate oxide film 5.

Figure 18:
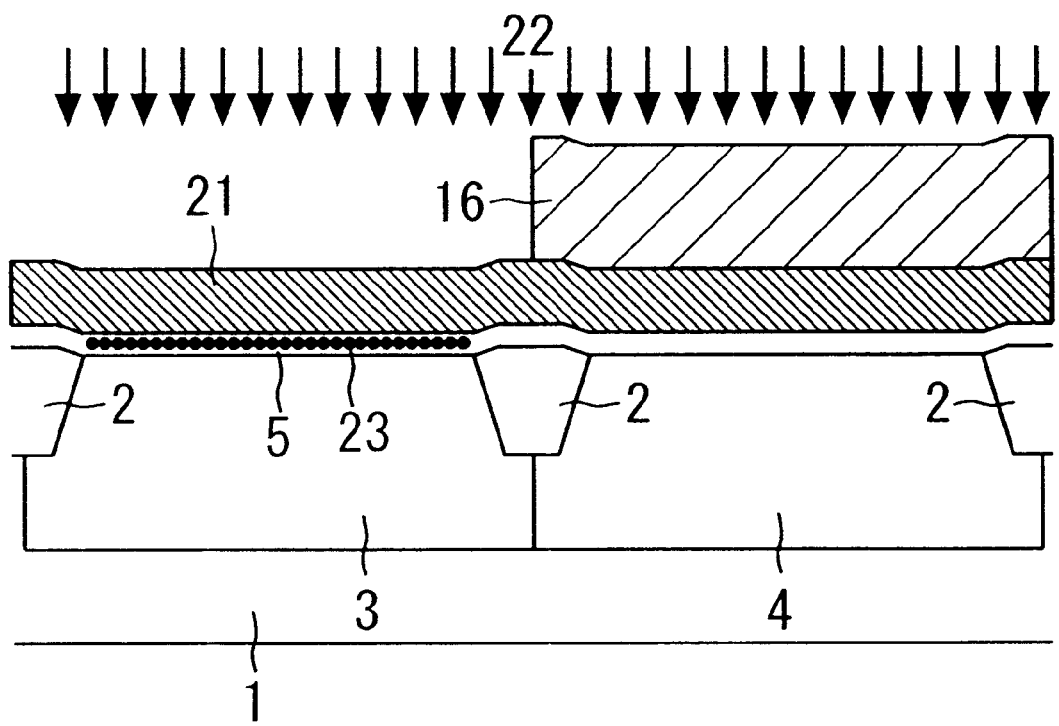

As shown in FIG. 18, through photolithography a resist mask 16 is formed on the area of the boron-doped polycrystalline silicon layer 21 corresponding to the n-well 4. The area of the boron-doped polycrystalline silicon layer 21 corresponding to the p-well 3 is exposed to ultraviolet rays 22, so that fixed positive electric charges 23 are formed within the area of the gate oxide film 5 corresponding to the p-well 3.

As shown in FIG. 19, gate electrodes are formed through photolithography and etching by use of a resist mask. A lightly doped drain (LDD) region (N−) 8 of the n-channel MOSFET and a lightly doped drain (LDD) region (P−) 9 of the p-channel MOSFET are each formed through photolithography and ion implantation. The gate electrode of the n-channel MOSFET shown in FIG. 19 is formed from the boron-doped polycrystalline silicon layer 21 (or a gate electrode 21) and the gate oxide film 5. The gate electrode of the p-channel MOSFET is formed from the boron-doped polycrystalline silicon layer 21 (the gate electrode 21) and the gate oxide film 5.

As shown in FIG. 20, through CVD side walls 10 are formed from an oxide film on both sides of each of the gate oxide film 5 and the gate electrode 21. An N+ source/drain region 11 of the n-channel MOSFET and a P+ source/drain region 12 of the p-channel MOSFET are each formed through photolithography and ion implantation, thereby resulting in formation of a semiconductor device of CMOS structure comprising a surface-type n-channel MOSFET of single gate structure and a surface-type p-channel MOSFET of single gate structure.

Figure 21:
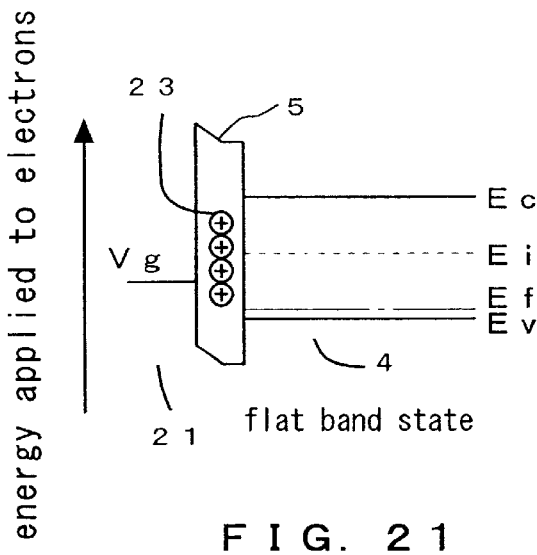
FIG. 21 shows the flat band state of the p-channel MOSFET.
Figure 22:
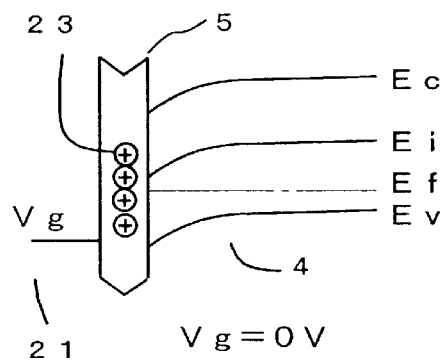
FIG. 22 shows a bend in the energy band when Vg=0V.
Figure 23:
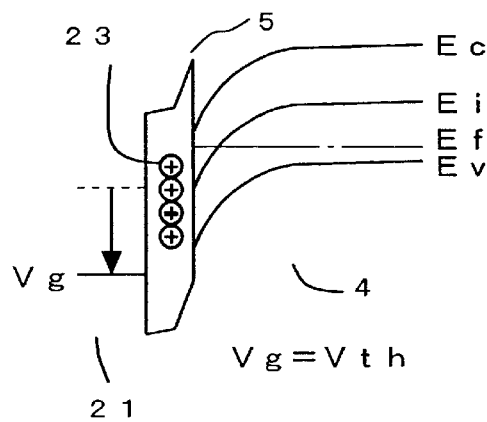
FIG. 23 shows an energy band when Vg=Vth.

By reference to FIGS. 21 through 23 showing energy bands, there is described the reason why the threshold voltage Vth does not become high even when a surface-type p-channel MOSFET is formed from the boron-doped polycrystalline silicon according to the embodiment 3.

FIG. 21 shows the flat band state of the p-channel MOSFET. As shown in FIG. 21, although the energy band of the n-well 4 is flat, a potential difference develops in the gate oxide film 5 by virtue of existence of the fixed electric charges 23 in the gate oxide film 5. Therefore, there is a potential difference between the gate electrode 21 and the Fermi energy Ef of the n-well 4.

FIG. 22 shows a bend in the energy band when Vg=0V. As shown in FIG. 22, the energy band is bent toward a direction in which a channel is established, by means of the fixed positive electric-charges 23.

FIG. 23 shows an energy band when Vg=Vth. Since the energy band is bent toward a direction in which the MOSFET is turned on when Vg=0V, as shown in FIG. 22, the gate potential Vg is only required to be increased slightly to the threshold voltage. Therefore, as shown in FIG. 23, the threshold voltage Vth assumes a value of about 0.6V.

As mentioned previously, according to the embodiment 3, an appropriate value for Vth is obtained in the surface channel MOSFET. Therefore, the present invention has an advantage of the ability to prevent problems associated with the dual gate structure; namely, a complicated process flow and etch residues or excessive etching due to a difference in etch rate between n-type polycrystalline silicon and p-type polycrystalline silicon. Further, since the surface channel MOSFET can be used, there can be realized a Vth which is lower than that required by a buried channel MOSFET.

As has been mentioned above, according to the present invention, formation of fixed electric charges within a gate oxide film enables provision of a semiconductor device comprising a surface-type n-channel transistor of single gate structure and a surface-type p-channel transistor of single gate structure, as well as provision of a method of manufacturing the semiconductor device.

In the method of manufacturing a semiconductor device, the step of forming a polycrystalline silicon layer may be followed by a step of leaving a resist mask on the polycrystalline silicon layer of second conductivity type corresponding to the well of first conductivity type and doping, with boron ions, on the polycrystalline silicon layer of second conductivity type corresponding to the well of second conductivity type, and the step of forming a side wall may be followed by a step of forming fixed electric charges of second conductivity type by subjecting the corresponding wafer to a heat treatment, thereby diffusing the boron ions from the polycrystalline silicon layer of first conductivity type into the gate dielectric film.

In the method of manufacturing a semiconductor device, the step of forming a polycrystalline silicon layer may form on the gate dielectric film a polycrystalline silicon layer of first conductivity type, and the step of forming a polycrystalline silicon layer may be followed by a step of exposing to ultraviolet rays on the polycrystalline silicon layer of first conductivity type corresponding to the well of first conductivity type, thereby forming fixed electric charges of first conductivity type within the gate dielectric film corresponding to the well of first conductivity type.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

What is claimed is:

1. A single gate-type semiconductor device comprising:
    a semiconductor substrate of first conductivity type;
    a well of first conductivity type formed on said surface of the semiconductor substrate of first conductivity type;
    a well of second conductivity type formed on the surface of said semiconductor substrate of first conductivity type;
    a gate dielectric film formed over said well of first conductivity type and said well of second conductivity type through thermal oxidation;
    a polycrystalline silicon layer of second conductivity type formed on said gate dielectric film;
    a first gate formed on said well of first conductivity type by etching said polycrystalline silicon layer of second conductivity type and said gate dielectric film disposed on said well of first conductivity type;
    a second gate formed on said well of second conductivity type by etching said polycrystalline silicon layer of second conductivity type and said gate dielectric film disposed on said well of second conductivity type;
    a gate side wall formed on sidewalls of said first gate and said second gate; and
    fixed electric charges of second conductivity type within substantially all of said gate dielectric film of said second gate on said well of second conductivity type.

2. A semiconductor device according to claim 1, wherein said fixed electric charges with the gate dielectric film are within a range of $1\times10^{11}$ cm$^{-2}$ and $1\times10^{14}$ cm$^{-2}$.

3. A semiconductor device according to claim 1, wherein said fixed electric charges with the gate dielectric film are within a range of $1\times10^{12}$ cm$^{-2}$ and $1\times10^{13}$ cm$^{-2}$.

4. A semiconductor device according to claim 1, wherein said fixed electric charges with the gate dielectric film are within a range of $1\times10^{13}$ cm$^{-2}$ and $1\times10^{14}$ cm$^{-2}$.

5. A semiconductor device according to claim 1, wherein said fixed electric charges of second conductivity type are substantially evenly distributed across the entire gate dielectric film on said well of second conductivity type.

6. A single gate-type semiconductor device comprising:
    a semiconductor substrate of first conductivity type;
    a well of first conductivity type formed on said surface of the semiconductor substrate of first conductivity type;
    a well of second conductivity type formed on the surface of said semiconductor substrate of first conductivity type;
    a gate dielectric film formed over said well of first conductivity type and said well of second conductivity type through thermal oxidation;
    a polycrystalline silicon layer of first conductivity type formed on said gate dielectric film;
    a first gate formed on said well of first conductivity type by etching said polycrystalline silicon layer of first conductivity type and said gate dielectric film disposed on said well of first conductivity type;
    a second gate formed on said well of second conductivity type by etching said polycrystalline silicon layer of first conductivity type and said gate dielectric film disposed on said well of second conductivity type;

a gate side wall formed on sidewalls of said first gate and said second gate; and fixed electric charges of first conductivity type within said gate dielectric film of said first gate on said well of first conductivity type, wherein the number of said fixed electric charges of first conductivity type is greater than a number of fixed electric charges of first conductivity type within said gate dielectric film on said well of second conductivity type.

7. A semiconductor device according to claim 6, wherein said fixed electric charges of first conductivity type are substantially evenly distributed across the entire gate dielectric film on said well of first conductivity type.

* * * * *